United States Patent
Irons et al.

(10) Patent No.: US 10,524,320 B1
(45) Date of Patent: Dec. 31, 2019

(54) HIGH-VOLTAGE LINEAR LIGHTING WITH CONDUCTOR SERVICE LOOPS

(71) Applicant: Elemental LED, Inc., Reno, NV (US)

(72) Inventors: Travis Irons, Reno, NV (US); Adam L Pruitt, Reno, NV (US)

(73) Assignee: Elemental LED, Inc., Reno, NV (US)

( * ) Notice: Subject to any disclaimer, the term of this patent is extended or adjusted under 35 U.S.C. 154(b) by 0 days.

(21) Appl. No.: 16/539,266

(22) Filed: Aug. 13, 2019

(51) Int. Cl.
| | |
|---|---|
| *H05B 33/08* | (2006.01) |
| *F21K 9/20* | (2016.01) |
| *F21S 4/20* | (2016.01) |
| *F21S 4/24* | (2016.01) |
| *H05K 1/18* | (2006.01) |

(52) U.S. Cl.
CPC ........... *H05B 33/0806* (2013.01); *F21K 9/20* (2016.08); *F21S 4/20* (2016.01); *F21S 4/24* (2016.01); *H05K 1/181* (2013.01); *H05K 2201/10106* (2013.01)

(58) Field of Classification Search
CPC .... F21K 9/20; F21K 9/90; F21S 4/001; F21S 4/003; F21S 4/006; F21S 4/008; F21S 4/10; F21S 4/20; F21S 4/22; F21S 4/28; F21V 15/01; F21V 15/015; F21V 19/001; F21V 19/003; F21V 19/005; F21V 21/002; F21V 21/025; F21V 21/0808; F21V 23/002; F21V 23/005; F21V 23/06; F21V 29/004; F21V 31/04; F21V 5/04; F21V 21/005; F21Y 2101/02; F21Y 2103/10; F21Y 2115/10; G08B 5/36; G09F 13/0404; G09F 13/22; G09F 2013/222; H05K 1/0278; H05K 1/028; H05K 1/05; H05K 1/148; H05K 1/189; H05K 2201/046; H05K 2201/09081; H05K 2201/0909; H05K 2201/10106; Y10S 362/80; H01R 13/62; H01R 13/6272; H01R 4/5066
See application file for complete search history.

(56) References Cited

U.S. PATENT DOCUMENTS

| | | | | |
|---|---|---|---|---|
| 6,659,623 | B2 * | 12/2003 | Friend ................... | F21V 21/002 250/504 R |
| 8,714,772 | B1 | 5/2014 | Levante et al. | |
| 9,109,776 | B2 * | 8/2015 | Smith ....................... | F21V 5/04 |

(Continued)

OTHER PUBLICATIONS

Jesco Lighting Group, LLC, "Infina." Internet. Available at http://www.jescolighting.com/documents/Catalogs/DL-AC-FLEX.pdf. Sep. 2014.

*Primary Examiner* — Renan Luque
(74) *Attorney, Agent, or Firm* — United IP Counselors, LLC (57) ABSTRACT

Linear lighting is disclosed. The linear lighting includes a narrow, elongate printed circuit board (PCB). A plurality of LED light engines are disposed on the PCB and are electrically connected to it. The PCB is divided physically and electrically into repeating blocks, which are physically in series with one another and electrically in parallel. A pair of conductors extends the entire length of the linear lighting. Each of the conductors has a service loop corresponding to the position of each of the cut points. A covering encapsulates the PCB and the pair of conductors. The service loops in the conductors provide for additional length of conductor when the linear lighting is cut at a cut point, so that the linear lighting can be connected to power.

16 Claims, 5 Drawing Sheets

(56) References Cited

U.S. PATENT DOCUMENTS

| | | |
|---|---|---|
| 9,620,889 B1 | 4/2017 | Buck et al. |
| 9,671,075 B2 | 6/2017 | Greene |
| 9,746,144 B1 | 8/2017 | Greene |
| 10,028,345 B2 | 7/2018 | Petersen et al. |
| 10,041,636 B2 | 8/2018 | Petersen et al. |
| 10,222,036 B2 * | 3/2019 | Dubuc .................. H05K 1/028 |
| 2003/0071581 A1 * | 4/2003 | Panagotacos ............. F21V 5/04 |
| | | 315/185 R |
| 2006/0133076 A1 * | 6/2006 | Sloan ................... F21V 33/006 |
| | | 362/216 |
| 2008/0025022 A1 * | 1/2008 | Schinzel ................... F21S 4/10 |
| | | 362/249.01 |
| 2008/0030981 A1 * | 2/2008 | Mrakovich ............ G02B 6/001 |
| | | 362/219 |
| 2010/0277666 A1 * | 11/2010 | Bertram .................... F21K 9/00 |
| | | 349/61 |
| 2013/0188357 A1 * | 7/2013 | Sloan .................. G09F 13/0404 |
| | | 362/249.01 |
| 2014/0247595 A1 * | 9/2014 | Lind .................. G09F 13/0404 |
| | | 362/249.04 |
| 2016/0138768 A1 | 5/2016 | Greene |
| 2017/0299132 A1 | 10/2017 | Greene |
| 2018/0031190 A1 | 2/2018 | Nicolai et al. |

\* cited by examiner

HIGH-VOLTAGE LINEAR LIGHTING WITH CONDUCTOR SERVICE LOOPS

BACKGROUND OF THE INVENTION

1. Field of the Invention

The invention relates to high-voltage linear lighting.

2. Description of Related Art

Linear lighting is a type of lighting based on light-emitting diodes (LEDs) in which a long, narrow printed circuit board (PCB) has LED light engines mounted on it, spaced at a regular interval or pitch. The PCB may be either rigid or flexible and may also include other circuit elements, like resistors and current controllers, if needed to drive the LED light engines. By joining short sections of PCB, linear lighting can be manufactured to virtually any length.

In general, the higher the operating voltage of the linear lighting, the longer the run length (i.e., the usable working length) of the linear lighting can be. High-voltage linear lighting is described, for example, in U.S. Pat. No. 9,620,889, the contents of which are incorporated by reference herein in their entirety. In the linear lighting described in this patent, the PCB with light engines is surrounded by a clear plastic extrusion, such as clear polyvinyl chloride (PVC). The clear extrusion provides electrical insulation. A pair of conductors runs the length of the linear lighting, with each conductor disposed in its own compartment within the PVC insulation, one conductor on each side of the PCB. The linear lighting is arranged physically and electrically into repeating blocks, with physical cut points between the blocks that allow the linear lighting to be cut to particular lengths. The conductors are connected by jumper wires to the PCB in each repeating block, placing each repeating block of the linear lighting electrically in parallel with the others.

Linear lighting of this type is usually delivered in large spools. At the time of sale, it undergoes finishing manufacturing steps to cut it to length and connect it to power. To do so, the strip of linear lighting is cut at a cut point and the insulation is stripped away to expose the conductors within the linear lighting. This may be done either manually or by using, e.g., a pneumatic tool that performs the cutting and stripping as a single operation. The exposed conductors are then connected to leads from a power cable or cord, e.g., with crimps or using terminal blocks. U.S. Pat. No. 9,620,889 describes a number of connection boxes that are used to make the connection between the internal conductors of the linear lighting and a power cable.

The difficulty with this procedure is that after the cutting and stripping operations, the exposed conductors may be very short, making it difficult to fit them into crimps, terminal blocks, or whatever other connecting hardware is to be used. It is possible to make the exposed conductors longer, but this can typically only be done by sacrificing an otherwise useable portion of the product, which is wasteful and adds to manufacturing and product costs.

SUMMARY OF THE INVENTION

In general, aspects of the invention provide linear lighting with internal conductors that have "service loops" that provide for additional available length for making connections when the linear lighting is cut and connected to power.

More particularly, one aspect of the invention relates to linear lighting. The linear lighting comprises a narrow, elongate printed circuit board (PCB), a plurality of LED light engines disposed on and electrically connected to the PCB, a pair of conductors, and a covering. The PCB has at least one cut point. The pair of conductors is separate from the PCB and electrically connected to the PCB. Each of the pair of conductors extends in parallel with, and substantially the entire length of, the PCB. Each of the pair of conductors has a service loop at a position corresponding to the cut point. The covering encapsulates the PCB and the pair of conductors. In some embodiments, the PCB and covering may be flexible, and the covering may be transparent.

Another aspect of the invention also relates to linear lighting. In the linear lighting, a narrow, elongate printed circuit board (PCB) is arranged in repeating blocks. The repeating blocks are physically in series and electrically in parallel with one another. Each repeating block has a plurality of LED light engines disposed on and electrically connected to the PCB. The repeating blocks have cut points between them. A pair of conductors extends in parallel with and substantially an entire length of the PCB. The pair of conductors is connected to each of the repeating blocks to place the repeating blocks electrically in parallel with one another. Each of the pair of conductors has a service loop corresponding in position with each of the cut points. A covering encapsulates the PCB and the pair of conductors. In some embodiments, the PCB and covering may be flexible, and the covering may be transparent.

Other aspects, features, and advantages of the invention will be described below in more detail.

BRIEF DESCRIPTION OF THE DRAWING FIGURES

Embodiments of the invention will be described with respect to the following drawing figures, in which like numerals represent like features throughout the drawings, and in which.

DETAILED DESCRIPTION

Figure 1:
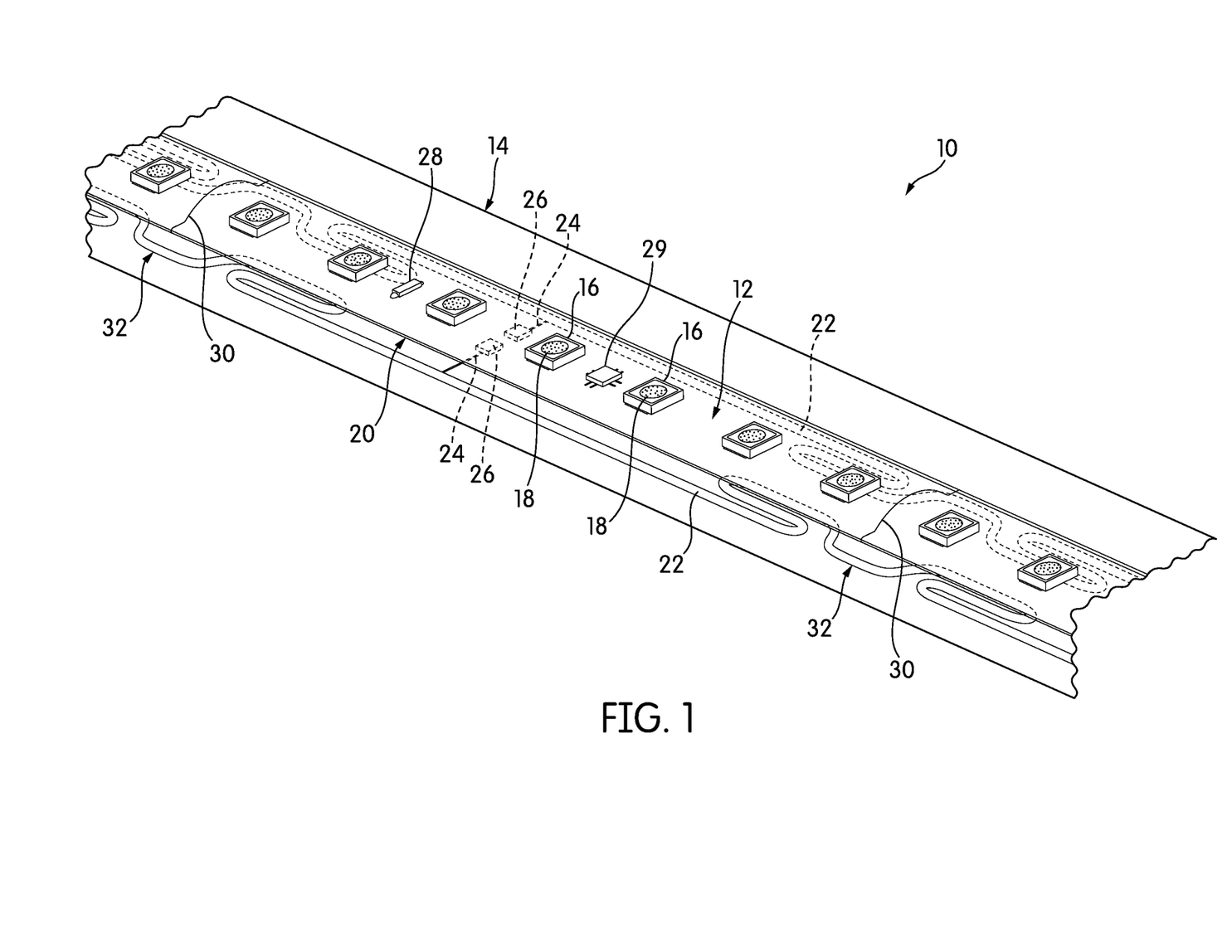
FIG. 1 is a perspective view of high-voltage linear lighting with conductor service loops.
Figure 2:
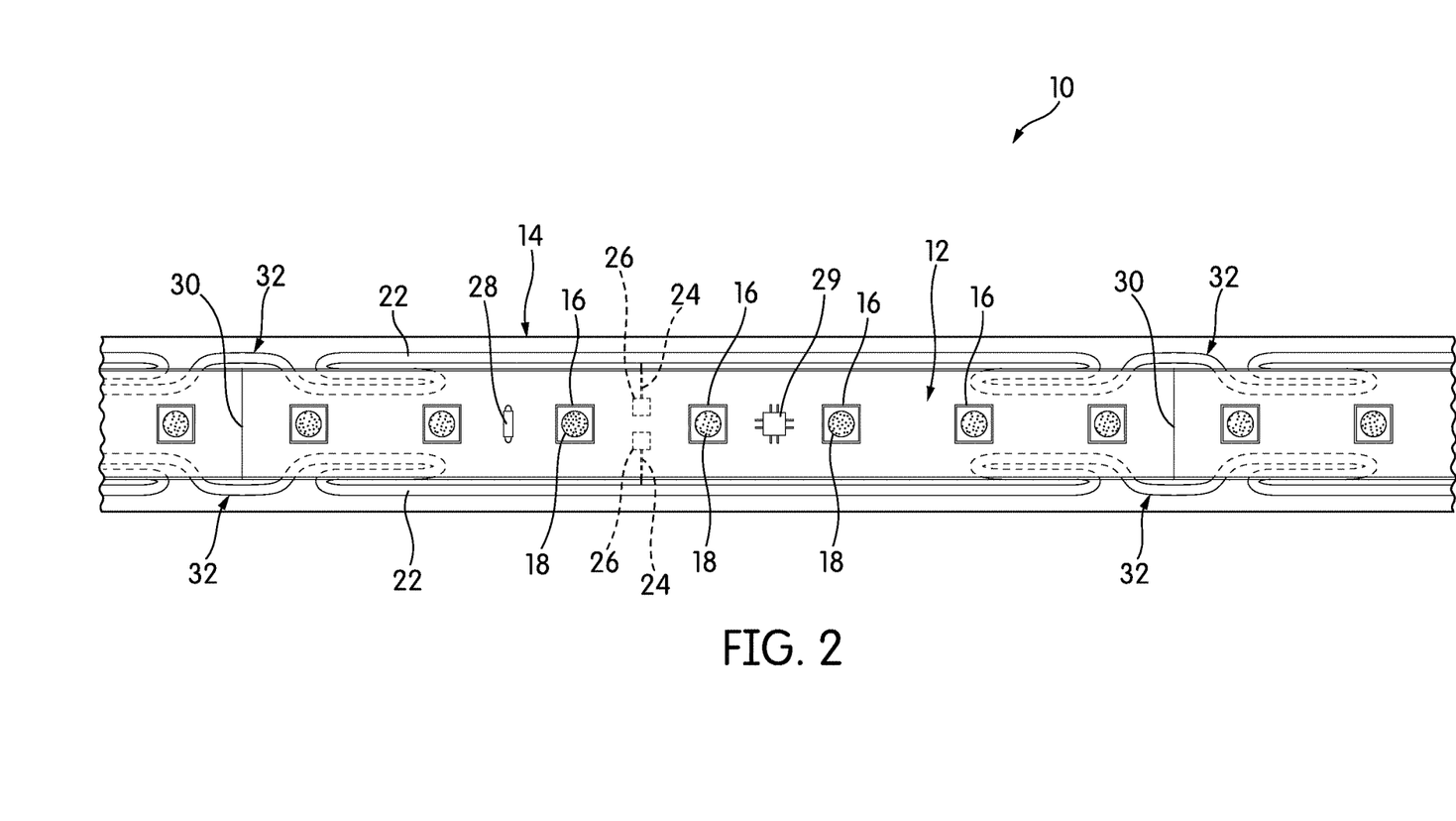
FIG. 2 is a top plan view of the linear lighting of FIG. 1.

FIG. 1 is a perspective view of a section of linear lighting, generally indicated at 10, according to one embodiment of the invention, and FIG. 2 is a top plan view of the linear lighting 10. The linear lighting 10 comprises a printed circuit board (PCB) 12 encapsulated within a clear, flexible covering 14. Disposed on the PCB 12 and electrically connected to it are a number of LED light engines 16, spaced at a regular pitch.

In various embodiments, the linear lighting 10 may operate at any essentially any voltage. For example, a particular number of LED light engines 16 with particular forward voltages may be chosen to suit essentially any operating voltage, and the other electrical components of the linear lighting 10 may be similarly selected to accommodate any operating voltage. A version of the linear lighting 10 that operates at low voltage may be useful in a number of interior and exterior household and commercial lighting applications. However, low-voltage embodiments of the linear lighting 10 will be limited in useable length as compared with high-voltage embodiments because of ohmic voltage drop. Thus, much of this description will assume that the linear lighting operates at high voltage, and in particular, at line voltage. While the definition of "high voltage" varies somewhat depending on the authority one consults, for purposes of this description, the term "high voltage" refers to voltages over about 50V, whether alternating current (AC) or direct current (DC). The term "line voltage" refers to the standard voltage found in junction boxes and at power outlets in a particular country or region. Line voltage may differ between commercial and residential settings. In the United States, line voltage is 120 VAC for residential and light commercial settings; in some other parts of the world, line voltage ranges from, e.g. 220-240 VAC for residential and light commercial settings.

As the term is used here, an "LED light engine" refers to one or more light-emitting diodes (LEDs) placed within a package for mounting and electrical connection to a PCB 12. The package of an LED light engine typically includes standard solder pads and connects to the LEDs themselves via fine wires. Other forms of packaging, such as chip-on-board packaging, may also be used. The LEDs themselves may emit any of a number of colors. In certain cases, the LED light engine may include a number of LEDs that emit different colors. For example, a single LED light engine may include red, green, and blue LEDs that are separately connected to power so that the LED light engine can emit any of a number of different colors by mixing red, green, and blue.

In many applications, the LED or LEDs inside an LED light engine 16 will be blue-emitting LEDs (e.g., indium gallium nitride LEDs). If the LED light engine 16 is to emit white light, a phosphor 18 is cured atop each LED light engine 16. The phosphor absorbs the blue light (or whatever other color the LEDs emit) and re-emits a broader spectrum of wavelengths.

The PCB 12 itself may be either rigid, made of a material like aluminum or FR4, or it may be flexible, made, for example, of narrow polyimide or Mylar, a form of biaxially-oriented polyethylene terephthalate. In most embodiments, the PCB 12 will be flexible.

The covering 14 of the linear lighting 10 may be an extrusion or some other kind of encapsulation. If covering 14 is an extrusion, it may be extruded in a single step or in multiple steps. Although clear, thermoplastic polyvinyl chloride (PVC) is the most common material for the covering 14, any extrudable thermoplastic may be used, and that thermoplastic need not be entirely transparent. Instead, the covering 14 could be, for example, opaque in non-light emitting portions and translucent or transparent in areas through which light is emitted.

As another example, the covering 14 could be a molded encapsulation created by pouring resins, such as a two-part polyurethane resin system or a two-part silicone resin system, over the PCB 12 and other components. Poured encapsulants may offer more advantages if the length of the linear lighting 10 is shorter. Any polymer used as the coating 14 may have various additives, including additives for flame retardance, flexibility, and ultraviolet (UV) light resistance, to name a few.

The linear lighting 10 is divided physically and electrically into repeating blocks. One full repeating block 20 and portions of two others are visible in the views of FIGS. 1 and 2. Each repeating block 20 is an electrically and physically complete section of linear lighting 10; connected to power, it will light up.

Although the repeating blocks 20 are physically in series with one another along the strip of linear lighting 10, the repeating blocks 20 are electrically in parallel with one another. More specifically, a pair of conductors 22 runs the length of the linear lighting 10 and is encapsulated with the PCB 12 in the covering 14. One conductor 22 is positioned on each side of the PCB 12. The conductors 22 are physically separated from the PCB 12, and may be separately insulated from the PCB 12 by the covering 14, as is the case in the illustrated embodiment. The conductors 22 serve as power and neutral lines and are rated to carry the full amount of power that the linear lighting 10 draws. (If needed, a third conductor could be provided as a ground.) The ends of the conductors 22 are typically connected to line power, either directly or through a filter or other such electronics. In each repeating block 20, jumper wires 24 connect each of the conductors 22 to solder pads 26 on the PCB 12. In the illustrated embodiment, the solder pads 26 are on the underside of the PCB 12, although they may be on either side and their location is not critical.

Beyond having several LED light engines 16 in each repeating block 20, the electrical configuration of the repeating blocks 20 may differ from embodiment to embodiment. For example, if the linear lighting 10 is intended to be driven using a constant current and a variable voltage, the repeating blocks 20 may include only the LED light engines 16 themselves. However, in most embodiments, the linear lighting 10 will be configured to operate at a constant voltage with a variable current that depends on the length of the linear lighting 10. Among other advantages, operating the linear lighting 10 at a constant voltage (presumably, line voltage) allows the linear lighting 10 to be of arbitrary length. However, constant-voltage linear lighting 10 typically requires additional components on the PCB 12 in each repeating block 20 in order to control the current provided to each of the LED light engines 16. These components may be resistors, current controller integrated circuits, and other such devices. A resistor 28 is shown on the PCB 12 for this purpose.

Each repeating block 20 may also carry components to rectify, filter, or otherwise modify the power that is delivered by the conductors 22. The illustrated embodiment includes a rectifier 29 that receives and rectifies the power that is delivered by the conductors 22. Other components may be included. For example, U.S. Pat. No. 10,028,345, the contents of which are incorporated by reference in their entirety, discloses a variety of different rectifier-filters for use in these applications. In general, each repeating block 20 may have any electrical components up to and including the components of a full switched-mode power supply. As a practical matter, though, cost and space usually limit the components in each repeating block 20.

Cut points separate adjacent repeating blocks 20. These cut points are typically marked by distinctive markings 30, which are usually lines or other types of rulings that are screen printed or otherwise placed on the PCB 12. A manufacturer or installer can thus cut through the covering 14 and the PCB 12 at the markings 30 to cut the linear lighting 10 to desired lengths. Conversely, if the linear lighting 10 is cut within a repeating block 20, that repeating block 20, or a portion of it, will not function. It should be understood, though, that a cut point need not be marked with any kind of marking. Rather, the term "cut point" should be construed to mean any point on the PCB 12 where the linear lighting can be cut without compromising the function of a repeating block 20, whether or not that point is marked with particular markings 30.

In linear lighting 10 according to embodiments of the present invention, the conductors 22 are made much longer than the linear lighting 10 and are arranged in such a way that extra lengths of the conductors 22 are available around the cut points that separate repeating blocks 20, in this case, coinciding with the positions of the markings 30. Specifically, each conductor 22 is formed into a service loop 32 at the end of each repeating block 20. The service loops 32 in each conductor 22 correspond in position to the cut points and the markings 30 that denote the cut points. As will be described below in more detail, this may provide extra length of each conductor 22, so that when the linear lighting 10 is cut at the end of a repeating block 20, it is easier to connect the resulting piece of linear lighting 10 to power.

The term "service loop," as used here, refers to any accumulation of additional length of conductor 22 that is deliberately formed and placed within the covering 14 for use when the linear lighting 10 is cut, regardless of the particular shape of that accumulation. In the illustrated embodiment, the service loops 32 are formed like the shape of the Greek character Ω, with the broad part of the loop compressed flat against the legs, and the very top of the loop inverted into line with the main extent of the conductor 22. Other shapes may be used, including flattened coils and zig-zag folds in the conductors 22.

Figure 3:
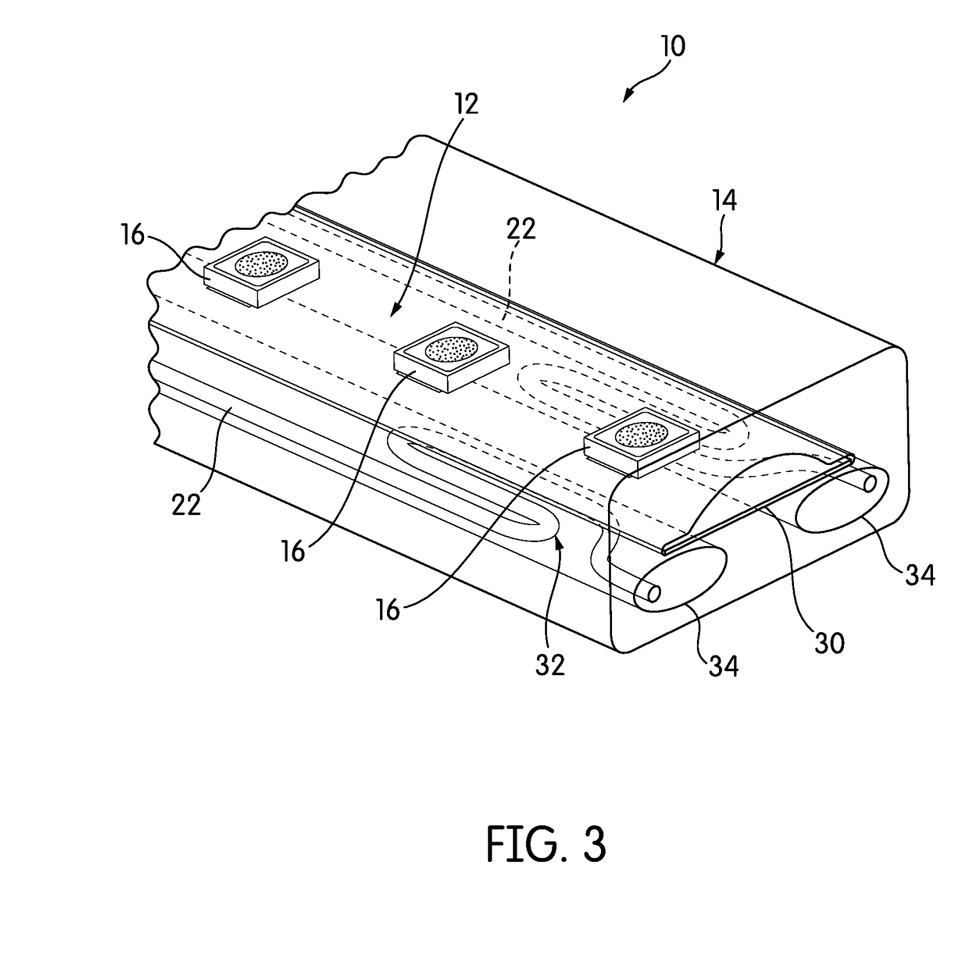
FIG. 3 is a perspective view of the linear lighting of FIG. 1, shown cut at a cut point.

FIG. 3 is a perspective view of the linear lighting 10 of FIG. 1, shown separated at the end of one of the repeating blocks 20. The conductors 22 are disposed within their own respective channels 34 in the covering 14, leaving space between the conductors 22 and the walls of the channels 34. In the illustrated embodiment, the channels 34 have a generally oval-shaped cross-section, but the shape of the channel is not critical and may be circular or rectangular, for example, in other cases, so long as it is large enough to accommodate the conductors 22 with their service loops 32.

Figure 4:
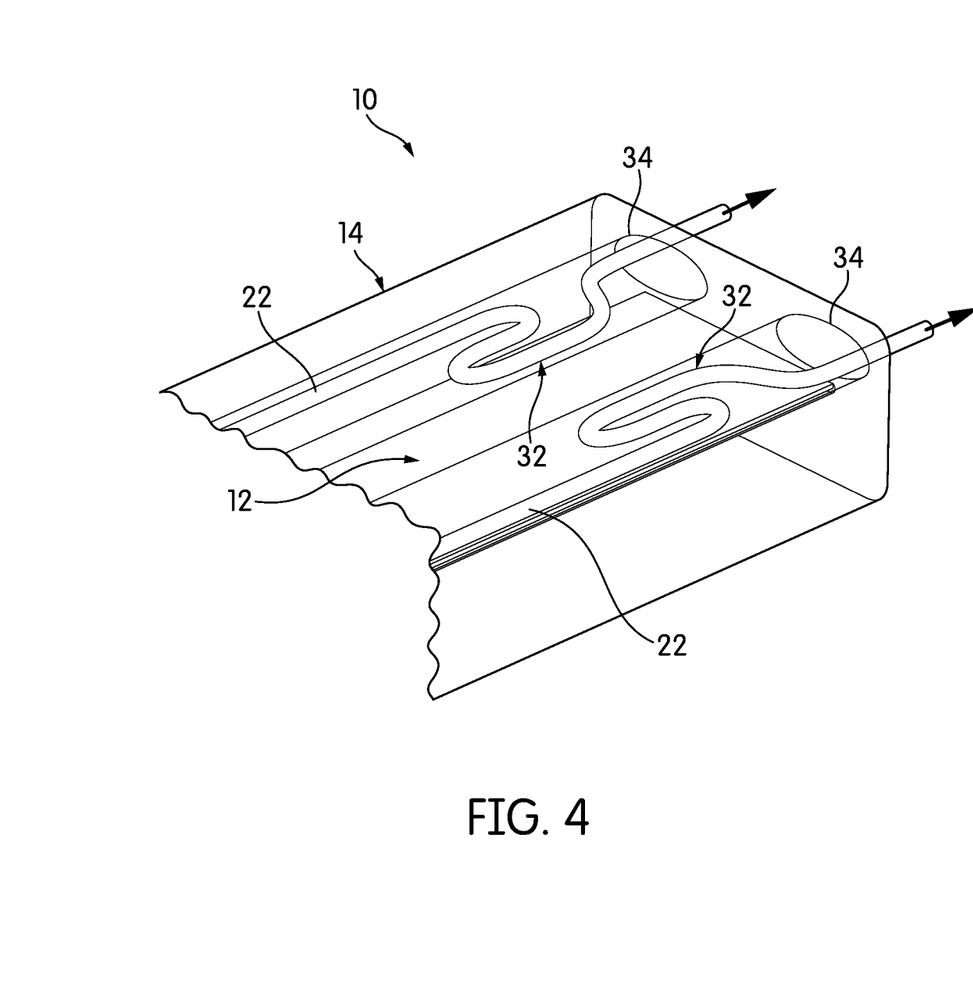
FIG. 4 is a perspective view similar to the view of FIG. 3 with the linear lighting inverted, showing the conductor service loops straightened and extended.

FIG. 4 is an inverted perspective view of the linear lighting 10, cut as in FIG. 3 and showing its underside and the details of the conductors 22 and service loops 32. Once the linear lighting 10 has been cut, the service loops 32 can be extended as needed to make power connections, either by inserting a tool into the channels 34 and pulling the ends of the conductors 22 out of their channels 34, or by stripping a small amount of the covering 14 back to expose the ends of the conductors 22 and pulling on the exposed ends. In either case, the cut service loop 32 is pulled straight. The conductors 22 can then be connected to power in any desired fashion.

The conductors 22 are typically made of braided wire, usually of cooper or aluminum, although they may be solid conductors, so long as they can flex with the linear lighting 10 without breaking. It is possible that in the course of manufacture, winding on a spool, and other operations, forces on the linear lighting 10 could cause the service loops 32 to dislodge from the positions shown in FIGS. 1-4. For that reason, the service loops 32 may be reinforced in order to prevent damage or movement until they are needed.

Figure 5:
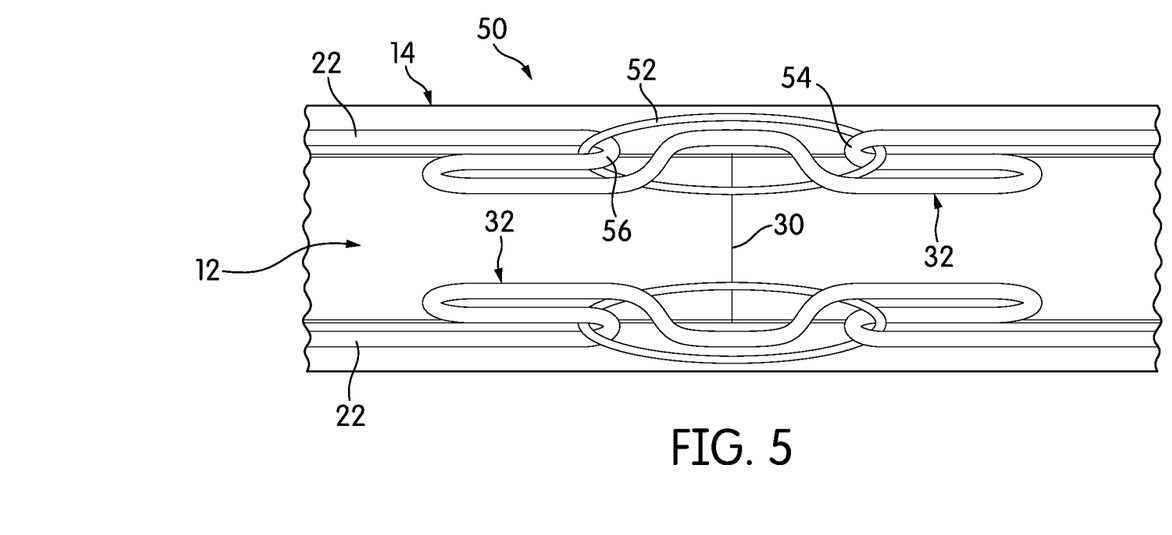
FIG. 5 is a bottom plan view of a portion of linear lighting according to another embodiment of the invention, illustrating conductors with reinforced service loops.

FIG. 5 is a bottom plan view of linear lighting 50 according to another embodiment of the invention. The linear lighting 50 of FIG. 5 includes all of the components of the linear lighting 10 described above: a PCB 12 encased within a covering 14. Conductors 22 run alongside the PCB 12 on each side, and each conductor 22 has a service loop 32 located at the cut point 30 between repeating blocks 20.$n$ The linear lighting 50 differs from the linear lighting 10 described above in that it includes an additional feature: flexible, at least substantially inextensible reinforcing loops 52, one per service loop 32 on each conductor 22, that connect between the two bends 54, 56 in the conductor 22 that establish each service loop 32. The reinforcing loops 52 may act as strain relief and help to keep the service loop 32 in place for when it is needed.

The reinforcing loops 52 themselves may be either conductive or non-conductive. If conductive, the reinforcing loops 52 may be made of either braided wire or solid conductor, although the reinforcing loops 52 may be made of a heavier gauge of wire than the conductors 22 themselves, for increased mechanical strength. It is helpful if the reinforcing loops 52 are formed of a material that will not cause an electrogalvanic reaction, or another kind of chemical or electrochemical reaction, with the material of which the conductors 22 are made.

If the reinforcing loops 52 are made of a nonconductive material, such as a plastic, that material should be capable of handling the power flowing through the conductors 22 without significantly softening, melting, charring, or causing an electrical arc or short. In either case, the reinforcing loops 52 should be of such a character that they can be cut through readily with standard wire cutters and other such standard cutting tools.

Figure 6:
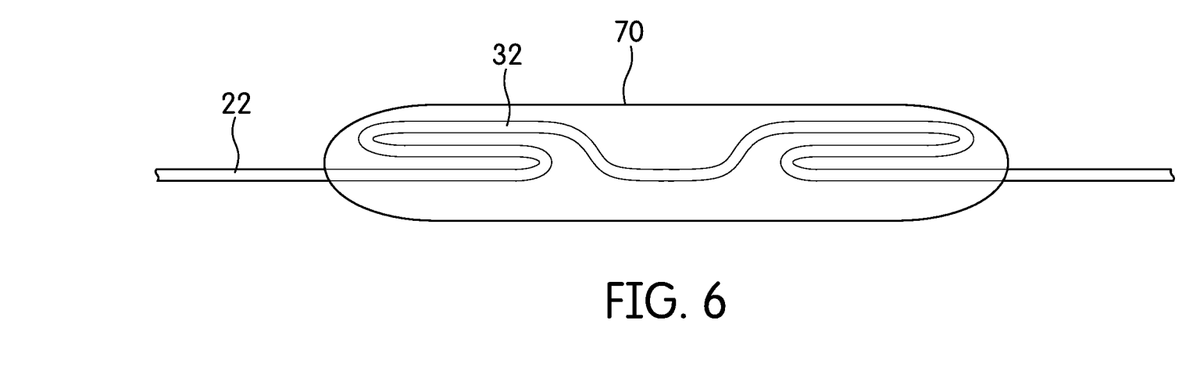
FIG. 6 is a plan view of a conductor in isolation, showing an encapsulated service loop.

There are any number of ways in which the service loops 32 may be reinforced, of which the reinforcing loops 52 are only one option. FIG. 6 is a plan view illustrating another alternative. More particularly, FIG. 6 illustrates a single conductor 22 in isolation, which includes a single service loop 32. The service loop 32 is encapsulated by an encapsulant 70.

The encapsulant 70 may be a cured polymer resin, such as the polyurethane and silicone resins described above; a thermoplastic polymer that has been extruded or molded around the service loop 32, an adhesive tape wrapped around the service loop 32 or any number of other types of encapsulants. The encapsulant 70, and the capsule it creates around the service loop 32, would typically remain on the service loop 32 in the manufactured and assembled product. Therefore, the encapsulant 70 should meet the same technical and functional criteria as the material of which the covering 14 is made, including its power ratings, flammability rating, and flexibility, to name a few. In many cases, it will be advantageous to use the same material as that used in the covering 14.

Depending on the way in which the linear lighting 10 is manufactured, the encapsulant 70 may provide several advantages. First, as described above, the encapsulant 70 may provide strain relief for the service loop 32. Additionally, the encapsulant 70 may protect the service loop 32 from deformation during forming processes like extrusion.

In this description, the term "about" means that variation around the stated value or range is permitted so long as the variation does not change the desired or described outcome. If it cannot be determined what set of values would change the desired or described outcome, the term "about" should be read to mean+5%.

While the invention has been described with respect to certain embodiments, the description is intended to be exemplary, rather than limiting. Modifications and changes may be made within the scope of the invention, which is defined by the appended claims.

What is claimed is:

1. Linear lighting, comprising:
   a narrow, elongate printed circuit board (PCB) the PCB having at least one cut point;
   a plurality of LED light engines disposed on and electrically connected to the PCB;
   a pair of conductors separate from the PCB and electrically connected to the PCB, the pair of conductors extending in parallel with and substantially an entire length of the PCB, each of the pair of conductors having a service loop at a position corresponding to the at least one cut point; and
   a covering encapsulating the PCB and the pair of conductors, each of the pair of conductors disposed in a separate channel within the covering such that the pair of conductors is completely separated from the PCB by the covering with additional conductors extending between the pair of conductors and the PCB to connect the pair of conductors electrically with the PCB.

2. The linear lighting of claim 1, wherein the linear lighting operates at high voltage.

3. The linear lighting of claim 1, wherein the service loops are separately encapsulated.

4. The linear lighting of claim 1, wherein reinforcing loops join a first portion of each service loop with a second portion of the same service loop.

5. The linear lighting of claim 1, wherein the PCB is flexible.

6. The linear lighting of claim 1, wherein the covering is flexible.

7. The linear lighting of claim 1, wherein the covering is transparent.

8. Linear lighting, comprising:
   a narrow, elongate printed circuit board (PCB) arranged in repeating blocks, the repeating blocks physically in series and electrically in parallel with one another, each repeating block having a plurality of LED light engines disposed on and electrically connected to the PCB, the repeating blocks having cut points therebetween;
   a pair of conductors extending in parallel with and substantially an entire length of the PCB, the pair of conductors being connected to each of the repeating blocks to place the repeating blocks electrically in parallel with one another, each of the pair of conductors having a service loop corresponding in position with each of the cut points; and
   a covering encapsulating the PCB and the pair of conductors, each of the pair of conductors disposed in a separate channel within the covering such that the pair of conductors is completely separated from the PCB by the covering with additional conductors extending between the pair of conductors and the PCB to connect the pair of conductors electrically with the PCB in each of the repeating blocks.

9. The linear lighting of claim 8, wherein the linear lighting operates at high voltage.

10. The linear lighting of claim 8, wherein the service loops are separately encapsulated.

11. The linear lighting of claim 8, wherein reinforcing loops join a first portion of each service loop with a second portion of the same service loop.

12. The linear lighting of claim 8, wherein each of the repeating blocks includes a resistor or a current controller.

13. The linear lighting of claim 12, wherein each of the repeating blocks includes a rectifier.

14. The linear lighting of claim 8, wherein the PCB is flexible.

15. The linear lighting of claim 14, wherein the covering is flexible.

16. The linear lighting of claim 15, wherein at least a portion of the covering through which light is emitted is transparent.

* * * * *